United States Patent [19]
Takahashi

[11] Patent Number: 5,852,625
[45] Date of Patent: Dec. 22, 1998

[54] DISTRIBUTED FEEDBACK SEMICONDUCTOR LASER

[76] Inventor: Koji Takahashi, Raport Tenri 850, 2613-1, Ichinomoto-cho, Tenri-shi, Nara-ken, Japan

[21] Appl. No.: 621,748

[22] Filed: Mar. 22, 1996

[30] Foreign Application Priority Data

Mar. 22, 1995 [JP] Japan .................................. 7-062560

[51] Int. Cl.$^6$ .............................. H01S 3/08; H01S 3/19
[52] U.S. Cl. .............................................. 372/96; 372/45
[58] Field of Search .................................. 372/96, 92, 43, 372/44, 45, 46, 50, 102

[56] References Cited

U.S. PATENT DOCUMENTS

| 5,363,399 | 11/1994 | Yagi | ........................................... 372/96 |
| 5,539,766 | 7/1996 | Ishino et al. | .............................. 372/96 |

FOREIGN PATENT DOCUMENTS 6-7624  1/1994  Japan .

OTHER PUBLICATIONS

Luo et al., "Gain–coupled distributed feedback semiconductor lasers with an absorptive conduction–type inverted grating" *IEEE Phototonics Technology Letters* (1992) 4(7):127–130. (Jul. 1992).

Nakano et al., "Facet reflection independent, single longitudinal mode oscillation in a GaAlAs/GaAs distributed feedback laser equipped with a gain–coupling mechanism" *Appl. Phys. Lett.* (1989) 55(16):1606–1608. (Oct. 1989).

Shibata et al., "2.5Gb/s, 100km transmission characteristics of gain–coupled DFB laser diode" *National Convention of the Institute of Electronics, Information and Communication Engineers of Japan,* C–342 (1995) p. 342. A partial English translation also included herewith. (no month).

Borchert et al., "1.55$\mu$m gain–coupled quantum–well distributed feedback lasers with high single–mode yield and narrow linewidth" *IEEE Transactions Photonics Technology Letters* (1991) 3(11):955–957. (no month available).

*Primary Examiner*—Rodney B. Bovernick
*Assistant Examiner*—Luong-Quyen T. Phan

[57] ABSTRACT

The gain coupled distributed feedback semiconductor laser includes an active layer and a diffraction grating which is provided in the vicinity of the active layer and has a plurality of light absorption layer periodically arranged along a resonator length direction. A relationship among energy hv (h is Planck's constant, and v is a frequency of induced emission light), forbidden band width $E_g$ of the light absorption layer, and energy band width $\delta E$ where free electrons are thermally distributed satisfies $h\nu \geqq E_g + \delta E$.

8 Claims, 9 Drawing Sheets

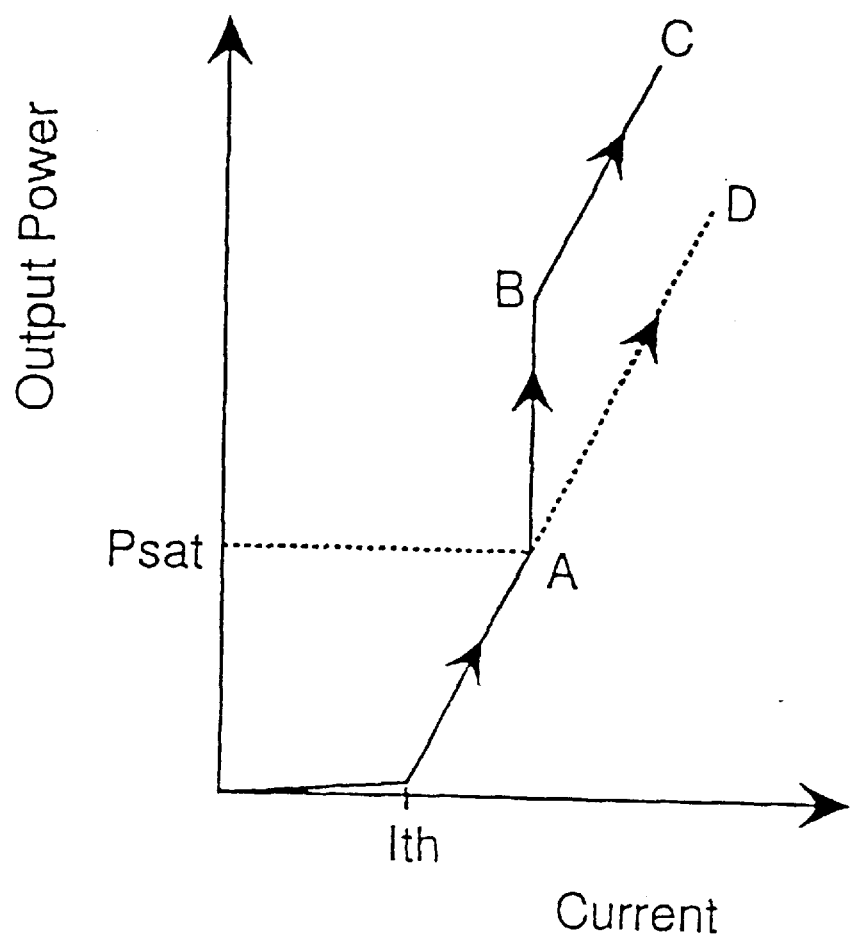

DISTRIBUTED FEEDBACK SEMICONDUCTOR LASER

BACKGROUND OF THE INVENTION

1. Field of the Invention

The present invention relates to a gain coupled distributed feedback semiconductor laser apparatus (hereinafter, referred to as "gain coupled DFB-LD") which oscillates in a single longitudinal mode.

2. Description of the Related Art

A gain coupled DFB-LD is characterized by an excellent single longitudinal mode oscillation and that noise is less likely to occur due to returning light. A gain coupled DFB-LD of a long wavelength, for instance having a wavelength of 1.33 or 1.5 μm, plays an important role as a light source in an ultra high speed optical communication apparatus, and a gain coupled DFB-LD of a wavelength shorter than about 1 μm plays an important role as a light source in an optical measuring apparatus, a high speed light transmission apparatus, and an optical recording apparatus.

A gain coupled DFB-LD has a double hetero-junction structure where an active layer emitting induced emission light is interposed between cladding layers which do not absorb the induced emission light. It also includes a diffraction grating in the vicinity of the active layer, and has a mechanism in which a distributed feedback of light because of the locational periodic change within the device of the gain of the induced emission light emitted from the active layer by the diffraction grating, thereby resulting in a laser oscillation (referred to as "gain coupling").

Conventionally, there are two methods using a method of periodically changing a gain of induced emission light by a diffraction grating. One is to periodically perturb the gain itself of the active layer (gain diffraction grating), and the other is to periodically form light absorption layers in the vicinity of the active layer so that a periodic perturbation on the gain effectively results (absorption diffraction grating). With regard to the latter, a fundamental structure is illustrated in Japanese Patent Publication No. 6-7624. Research in this regard is actively in progress.

FIG. 7 is a view illustrating a structure of a conventional gain coupled DFB-LD where a periodic perturbation on the gain occurs effectively by forming a periodic light absorption layer in the vicinity of an active layer (from IEEE PHOTONICS TECHNOLOGY LETTERS, VOL. 4, NO. 7 1992, P. 692). That is, an n type AlGaAs cladding layer 702 of 1.0 μm thickness, an undoped GaAs active layer 703 of 0.09 μm thickness, a p type AlGaAs carrier barrier layer 704 of 0.1 μm thickness, a p type -AlGaAs first guide layer 705 of 0.1 μm thickness, and an n type GaAs light absorption layer 706 of 50 nm thickness are successively crystal-grown on an n type GaAs substrate 701 by metal organic chemical vapor deposition (MOCVD). A diffraction grating 707 is formed by both double beam interference exposure and wet etching, periodically removing the n type GaAs light absorption layer 706. Then, a p type AlGaAs second guide layer 708 of 0.1 μm thickness, a p type AlGaAs cladding layer 709 of 1.0 μm thickness, and a p type GaAs contact layer 710 of 0.5 μm thickness are grown thereon, thereby obtaining a device.

In the conventional example of FIG. 7, an absorption layer of inverted conductivity type is used in order to curb absorption saturation of the absorption diffraction grating. However, when a semiconductor laser is driven at high output, optical density within the device becomes very large and, consequently, an absorption saturation could result within the light absorption layer of the conventional gain coupled DFB-LD. If the absorption saturation in the light absorption layer results, then the gain coupling by the absorption diffraction grating does not occur and a single longitudinal mode oscillation is damaged.

SUMMARY OF THE INVENTION

The gain coupled distributed feedback semiconductor laser includes an active layer and a diffraction grating which is provided in the vicinity of the active layer and has a plurality of light absorption layer periodically arranged along a resonator length direction. A relationship among energy hv (h is Planck's constant, and v is a frequency of induced emission light), forbidden band width $E_g$ of the light absorption layer, and energy band width $\delta E$ where free electrons are thermally distributed satisfies $hv \leq E_g + \delta E$.

In one embodiment of the present invention, the periodic light absorption layer is formed of n type $Al_xGa_{1-x}As$ ($0 \leq x \leq 1$), a thickness of the periodic light absorption layer is larger than a de Broglie wavelength of an electron, and a difference between the energy hυ of the induced emission light and the forbidden band width $E_g$ of the periodic light absorption layer is about 0.13 eV or greater.

In another embodiment of the present invention, the periodic light absorption layer is formed of p type $Al_xGa_{1-x}$ As ($0 \leq x \leq 1$), a thickness of the periodic light absorption layer is larger than a de Broglie wavelength of an electron, and a difference between the energy hυ of the induced emission light and the forbidden band width $E_g$ of the periodic light absorption layer is about 0.08 eV or greater.

In another embodiment of the present invention, the periodic light absorption layer is formed of n type $In_{1-y}Ga_yAs_{1-z}P_z$ ($0 \leq y \leq 1$, $0 \leq z \leq 1$), a thickness of the periodic light absorption layer is larger than a de Broglie wavelength of an electron, and a difference between the energy hυ of the induced emission light and the forbidden band width $E_g$ of the periodic light absorption layer is about 0.15 eV or greater.

In another embodiment of the present invention, the periodic light absorption layer is formed of p type $In_{1-y}Ga_yAs_{1-z}P_z$ ($0 \leq y \leq 1$, $0 \leq z \leq 1$), a thickness of the periodic light absorption layer is larger than a de Broglie wavelength of an electron, and a difference between the energy hυ of the induced emission light and the forbidden band width $E_g$ of the periodic light absorption layer is about 0.1 eV or greater.

In one embodiment of the present invention, a cross-section of the plurality of light absorption layer sectioned by a plane perpendicular to the active layer and parallel to the resonator length direction is rectangular.

In one embodiment of the present invention, a cross-section of the plurality of light absorption layer sectioned by a plane perpendicular to the active layer and parallel to the resonator length direction is triangular.

According to one embodiment of the distributed feedback semiconductor laser of the present invention, a material for a periodic light absorption layer is selected such that electrons in a valence band of the periodic absorption layer are excited to an energy state higher than an energy state where free electrons in a conduction band are thermally distributed. As a result, absorption saturation in the light absorption layer is curbed. Therefore, a structure having stable single longitudinal mode characteristics even during high output can be obtained. Also, this structure may be achieved by making the forbidden band width of the periodic absorption layer to be larger than the energy of the induced emission light emitted from the active layer by a fixed amount, thereby effectively curbing saturated absorption.

When a difference between the forbidden band width of the active layer and that of the periodic absorption layer is large, an absorption coefficient of the periodic absorption layer does not fluctuate due to impurity densities or light energy, whereby a device having stable characteristics can be produced with excellent repeatability.

Thus, the invention described herein makes possible the advantage of providing a distributed feedback semiconductor laser which has a stable single longitudinal mode characteristics even during high output.

These and other advantages of the present invention will become apparent to those skilled in the art upon reading and understanding the following detailed description with reference to the accompanying figures.

BRIEF DESCRIPTION OF THE DRAWINGS

FIG. 9 is a graph describing an effect of saturated absorption on device characteristics.

DESCRIPTION OF THE PREFERRED EMBODIMENTS

The inventor of the present application predicted that since a semiconductor layer having a forbidden band width relatively close to that of an active layer was used as a light absorption layer in a conventional structure, furthermore, absorption saturation would easily occur in the light absorption layer. The inventor also considered as follows. In a case where the semiconductor layer having a forbidden band width relatively close to that of the active layer was used as the light absorption layer, an "absorption coefficient" which indicated the degree of absorption when induced emission light was absorbed in the periodic absorption layer would strongly be affected by the amount of a dopant impurity in the absorption layer or by the fluctuation of the wavelength of the induced emission light from the active layer. As a result, the characteristics of the resultant device would fluctuate and, in addition, there would also be a problem that when the device was lased, the absorption coefficient of the light absorption layer would greatly fluctuate due to the output thereof, and the single longitudinal mode characteristics could not be maintained.

First, the inventor of the present application carried out theoretical evaluations and subsequently confirmed experimentally of a construction to solve various problems in the conventional art and effects obtained thereby.

Figure 8A:
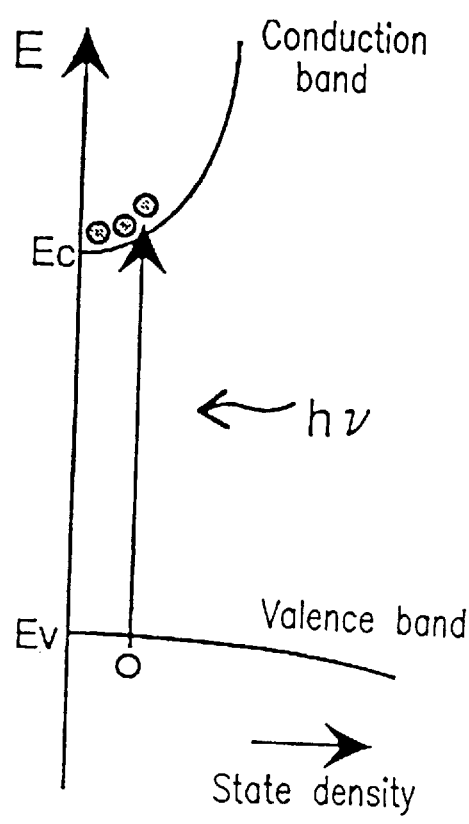
FIG. 8A is a diagram for describing carrier creation in a light absorption layer.
Figure 8B:
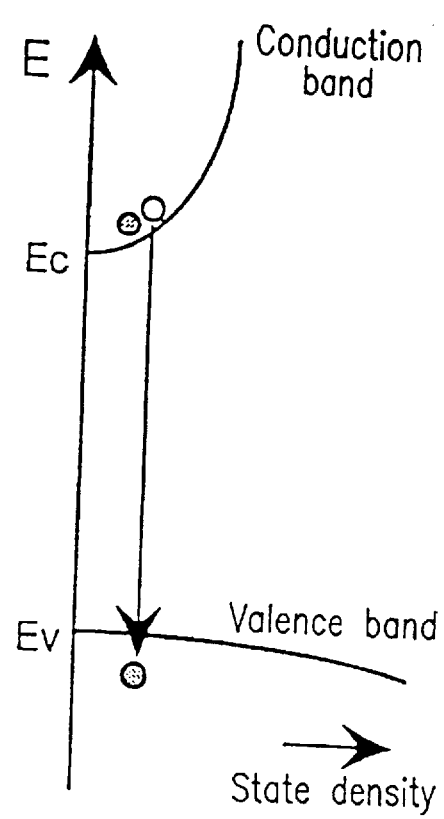
FIG. 8B is a diagram for describing carrier annihilation in the light absorption layer.

FIGS. 8A and 8B show band structures of a light absorption layer when the thickness of the light absorption layer is equal to the de Broglie wavelength of an electron (about 10 nm) or greater. When light emitted from the active layer (illustrated as hυ in FIG. 8A) is absorbed in the light absorption layer ($E_c - E_v < h\nu$ is the condition for absorption to occur), the carriers (electron-hole pair) within the light absorption layer are created. Although a portion of these carriers thus created annihilate by recombination as shown in FIG. 8B, other portions of them are constantly accumulated in the conduction band. The number of carriers accumulated in the light absorption layer has a quantum mechanical upper limit, and once it reaches that upper limit, carriers are no longer created and the light absorption in the light absorption layer no longer results. This condition is referred to as "saturated absorption" or "absorption saturation". Thermally excited free electrons already exists in the conduction band of the light absorption layer, and this is one of the reasons why the upper limit of the carriers created by the light absorption becomes low.

FIG. 9 shows an example of current-light output characteristics of a gain coupled DFB-LD when the saturated absorption has occurred. When light output exceeds a fixed value of $P_{sat}$, saturated absorption occurs. The output changes discontinuously from A to B, and since a gain coupling does not occur from B to C (saturated absorption occurs), single longitudinal mode characteristics deteriorate.

As a means to reduce the saturated absorption, it is effective that the quantum mechanical upper limit of the number of carriers which can be accumulated in the light absorption layer (state density) be as high as possible. That is, if the energy of the carriers created within the light absorption layer is larger than the average energy of the thermally excited free electron, then the state density is not affected by the excitation of the thermally excited free electron, and the saturated absorption does not occur up to high output.

Energy distribution of the thermally excited free electron has a width of about 0.1 eV with respect to the potential at the bottom (low energy end) of the conduction band while being stretched to the high energy side. Therefore, if the energy hυ of the induced emission light is greater than the forbidden band width $E_g$ of the periodic light absorption by about 0.1 eV, then it is considered that the state density is not affected by the thermally excited free electron and the absorption does not saturate up to high output.

That is, if a relationship among energy hυ (h is Planck's constant, and υ is a frequency of the induced emission light), forbidden band width $E_g$ of the light absorption layer, and energy band width δE where free electrons are thermally distributed satisfies hν≦$E_g$ +δE, then it is expected that the state density is not affected by the thermally excited free electron and the absorption does not saturate up to high output.

A plurality of devices having a difference between the forbidden band width of the periodic light absorption layer and the energy of the induced emission light as a parameter were produced while other production parameters (such as gain coupling constant) of the gain coupled DFB-LD were kept constant, and the above discussions were experimentally examined. It was confirmed that the saturation of the absorption layer did not occur up to high output when the above-mentioned difference was about 0.13 eV or greater in a case that an n type $Al_xGa_{1-x}As$ (0≦x≦1) was taken as the light absorption layer, and that the saturation did not occur up to high output when the above-mentioned difference was about 0.08 eV or greater in a case that a p type $Al_xGa_{1-x}As$ (0≦x≦1) was taken as the light absorption layer.

It is belived that the reason why the saturated absorption is likely to occur (i.e., a difference between the forbidden band width of the periodic light absorption layer with no saturation at the absorption layer and the energy of the induced emission light is large) when an n type semiconductor layer is used as the light absorption layer is because the number of free electrons thermally excited from the donor impurity level to the conduction band is large.

Similarly, for a $In_{1-y}Ga_yAs_{1-z}P_z$ (0≦y≦1, 0≦z≦1) system, it was confirmed that the saturation of the absorption layer did not occur up to high output when the above-mentioned difference was about 0.15 eV or greater in a case that an n type layer was used as the light absorption layer, and that the saturation did not occur up to high output when the above-mentioned difference was about 0.08 eV or greater in a case that a p type layer was used as the light absorption layer.

It is believed that the reason why the saturated absorption is more likely to occur for the InGaAsP system than for the AlGaAs system is because effective mass of the electron is lighter for the InGaAsP system and the state density in the conduction band is small.

In the present invention, there are other functions described as follows. Since the absorption coefficient of the periodic light absorption layer for the induced emission light generated from the active layer neither depends on the impurity density within the periodic light absorption layer nor on the light energy, the characteristics of the devices to be produced do not vary widely. The absorption coefficient of the light absorption layer neither changes due to the output of the device nor to the temperature change when the device is lased, and thereby stable device characteristics can be obtained with good repeatability.

The reason for these functions will be described for the case where the periodic absorption layer is made of GaAs. The light energy dependence of the absorption coefficient is illustrated for an n type GaAs of a bulk shape (i.e., the thickness is more than the de Broglie wavelength of an electron) and for a p type GaAs in FIG. 10A and FIG. 10B, respectively (from H. C. Casey, Jr. and M. B. Panish: Heterostructure Lasers, Academic Press (1978)). The density of impurity to be added in a case of a semiconductor laser is controlled within the range of about $5×10^{17}$ to about $5×10^{18}$ $cm^{-3}$. In this range, the absorption coefficient of the GaAs depends largely on the impurity density for light energy of about 1.55 eV or less in a case of an n type and for light energy of about 1.50 eV or less in a case of a p type (indicated as region A in FIGS. 10A and 10B). As a result, it is very difficult to obtain the absorption coefficient designed beforehand with good repeatability. At the same time, the absorption coefficient of the GaAs becomes largely dependent on the light energy, and the absorption coefficient of the periodic absorption layer varies among devices or production lots, thereby creating a problem of the repeatability of the device characteristics. On the other hand, the absorption coefficient neither depends on the impurity density nor on the light energy for the light with energy of about 1.55 eV for the n type and for the light with energy of about 1.50 eV for the p type but has a stable value of almost constant 12000 to 15000 $cm^{-1}$, thereby realizing a structure which excels in the repeatability during device production and the stability of the device operation (indicated as region B in FIGS. 10A and 10B).

Figure 10A:
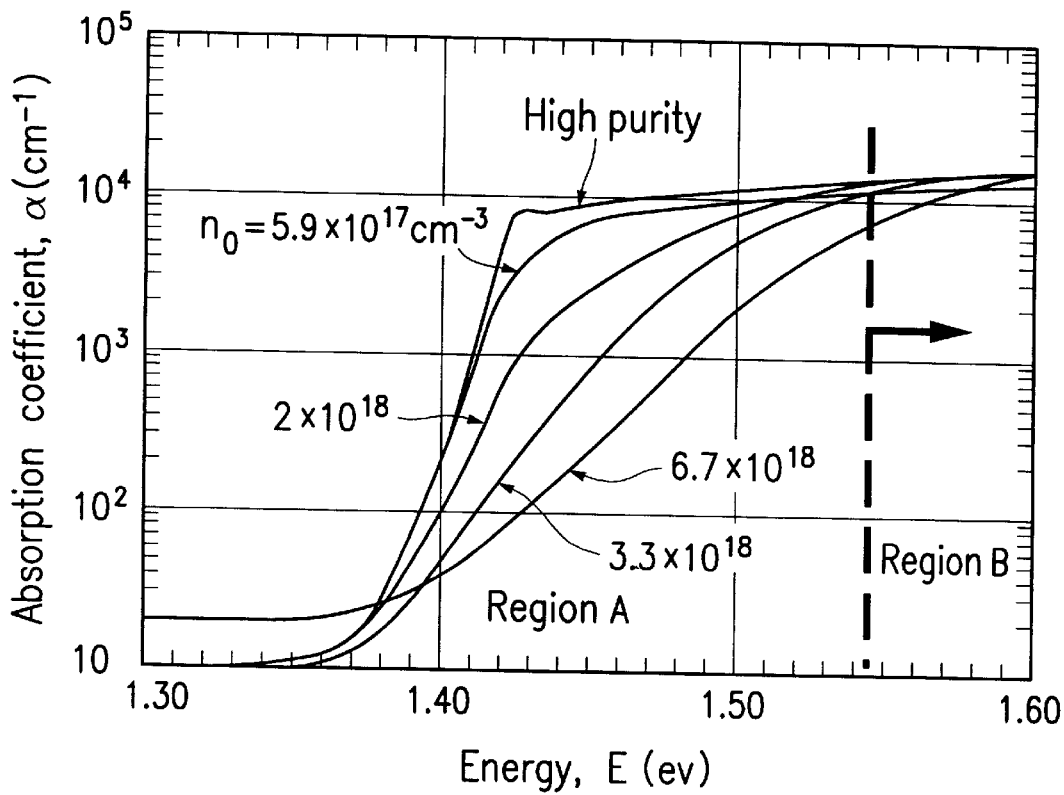
FIG. 10A is a graph illustrating light energy dependence of an absorption coefficient of an n type GaAs.
Figure 10B:
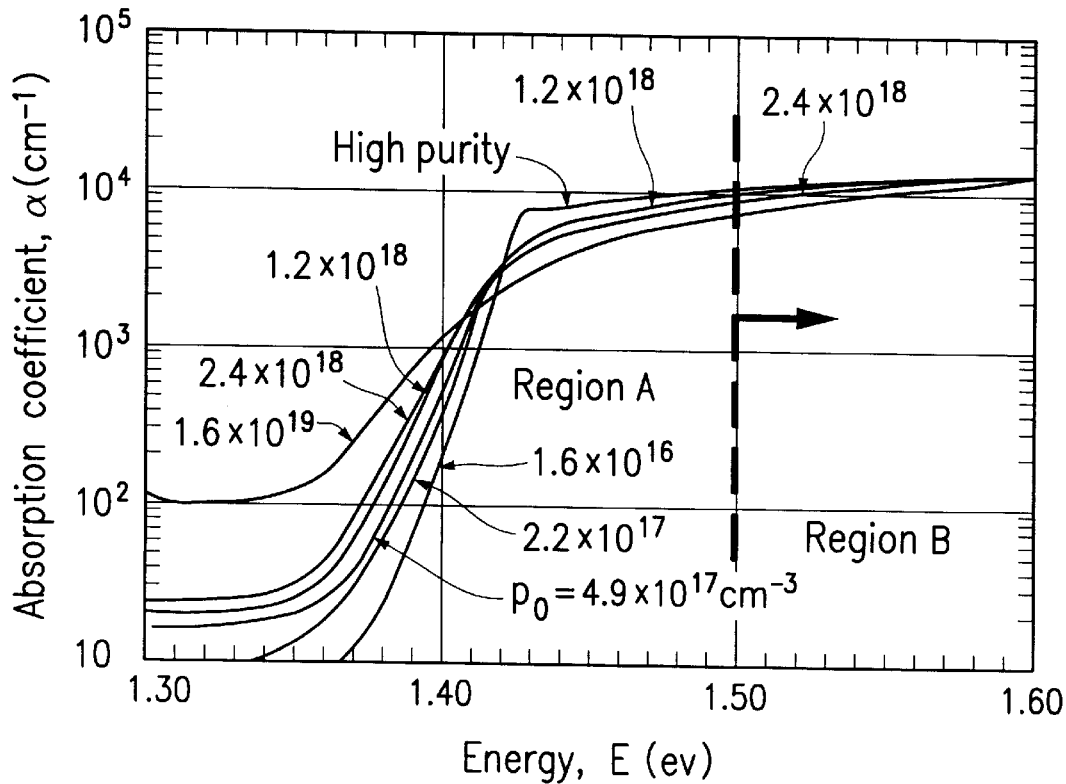
FIG. 10B is a graph illustrating light energy dependence of an absorption coefficient of a p type GaAs.

Therefore, since the forbidden band width of the GaAs is about 1.42 eV, if the difference between the forbidden band of the active layer and that of the absorption layer is about 0.13 eV or above, the above-mentioned effect can be expected. In particular, the effect is large for an n type GaAs which has a large fluctuation of the absorption coefficient due to the impurity density (FIG. 10A).

Hereinafter, preferred examples of the present invention will be described in more detail with reference to figures.

Figure 1:
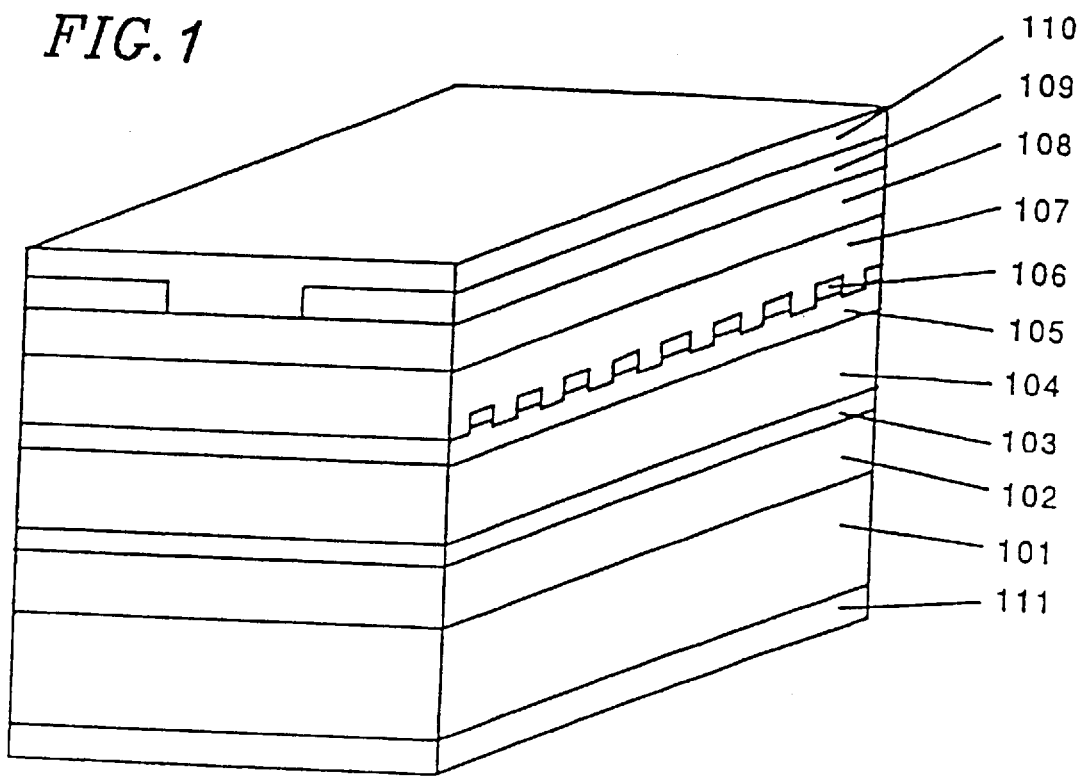
FIG. 1 is an isometric view illustrating a gain coupled DFB-LD of a first example.

FIG. 1 is an isometric view illustrating a structure of a distributed feedback semiconductor laser of a first example of the present invention. First, an n type $Al_{0.5}Ga_{0.5}As$ cladding layer 102 of 1 μm thickness, an undoped $Al_{0.1}Ga_{0.9}As$ active layer 103 of 0.08 μm thickness, a p type $Al_{0.45}Ga_{0.55}As$ carrier barrier layer 104 of 0.2 μm thickness, a p type $Al_{0.2}Ga_{0.8}As$ guide layer 105 of 0.05 μm thickness, and an n type GaAs light absorption layer 106 of 30 nm thickness are formed on an n type GaAs substrate 101 by a first epitaxial growth. In other word, the light absorption layer 106 is formed above the active layer 103 via the carrier barrier layer 104 and the guide layer 105. Due to this structure, the light absorption layer 106 is formed in the vicinity of the active layer 103. Next, a resist mask of a grating shape with a 0.36 μm pitch is formed on the light absorption layer 106 which is the highest layer of the grown layers by double beam interference exposure. Next using this resist mask, the light absorption layer 106 is etched with a mixture of chloric acid/hydrogen peroxide/pure water so that the light absorption layer becomes discontinuous, thereby producing a third order rectangular diffraction grating. This diffraction grating is provided in the vicinity of the active layer, and having a plurality of light absorption layer periodically arranged along a resonator length direction. In doing so, the duty of the diffraction grating is made to be as low as about 0.2 in order to keep the absorption loss due to the light absorption layer low. A term "duty" refers to a ratio (volume ratio) of an absorption region for every period within a layer where a periodic absorption layer exists. For example, in a case of a rectangular cross-section, the duty D is given by D =W/Λ (0≦D≦1) where Λ is the length of one period of the diffraction grating and W is the width of the light absorption layer in one period. Next, a p type $Al_{0.7}Ga_{0.3}As$ upper cladding layer 107 of 0.8 μm and a $p^+$ type GaAs contact layer 108 of 0.5 μm thickness are formed thereon by a second epitaxial growth.

Next an insulating film 109 of silicon nitride of about 0.2 μm thickness is formed on the $p^+$ type GaAs contact layer 108 by plasma CVD, and a stripe groove of a width of about 10 μm is formed on the silicon nitride insulating film by photolithography and etching using hydrofluoric acid. An electrode 110 made of AuZn is then formed on the entire surface. The substrate is thinned to about 100 μm thickness, and an AuGe/Ni electrode 111 is formed on the rear surface. Then the entire device is heat treated at 400° C. for three minutes and the device is completed.

In the present example where AlGaAs material system is used, the difference in the mixed crystal ratio between the active layer and the light absorption layer is 0.1, and the difference between the energy of the induced emission light (wavelength of 800 nm corresponds to energy of 1.55 eV) and the forbidden band of the light absorption layer corresponds to 0.13 eV. In this device, the discontinuity of light output-current characteristics which results from the saturated absorption by the absorption layer is not observed up to the light output of 50 mW or above, the oscillation at a stabilized single longitudinal mode is confirmed up to high output.

Figure 2:
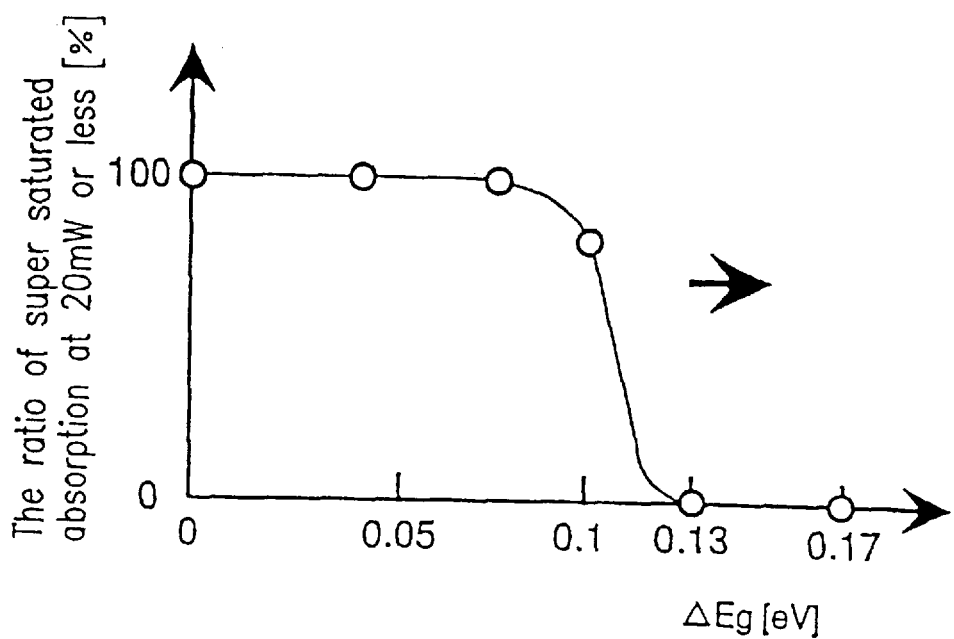
FIG. 2 is a graph illustrating the relationship between $\Delta E_g$, the difference between a forbidden band width of a light absorption layer and an energy value converted from the wavelength of induced emission light, and the frequency of occurring saturated absorption within the structure of the first example.

Devices having the same structure illustrated in the present example but having various values for the Al mixed crystal ratio of the absorption layer are produced, and a correlation between $\Delta E_g$, the difference between the forbidden band width of the periodic light absorption layer and the energy of the induced emission light, and the ratio of the number of devices which show the characteristics deterioration due to the saturated absorption under the light output of 20 mW is illustrated in FIG. 2. It was experimentally confirmed that the ratio of number of devices showing the saturated absorption under the light output of 20 mW when the difference of the Al mixed crystal ratio between active layer and absorption layer is 0.1 or above, i.e., $\Delta E_g$ is 0.13 eV or greater, is zero. When a DFB-LD is used as a light source for an optical recording apparatus, an output of at least 20 mW is required, and the characteristics satisfying this demand is obtained in the device of the present example. Here, these devices are produced such that even if $\Delta E_g$ is changed, other design parameters (such as gain coupling constant, light confinement factor of the active layer, or the like) are kept constant.

Figure 3:
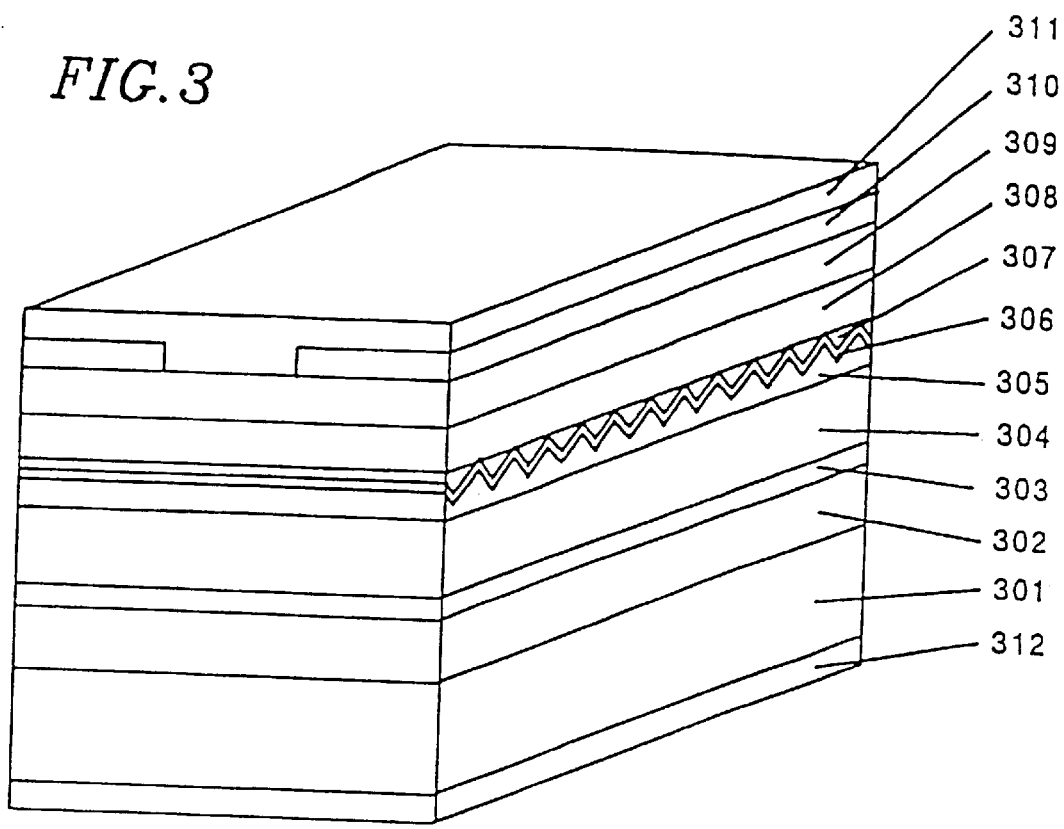
FIG. 3 is an isometric view illustrating a gain coupled DFB-LD of a second example.

FIG. 3 is an isometric view illustrating a structure of a distributed feedback semiconductor laser of a second example of the present invention.

First, an n type $Al_{0.6}Ga_{0.4}As$ cladding layer 302 of 1 μm thickness, an undoped $Al_{0.13}Ga_{0.87}As$ active layer 303 of 0.08 μm thickness, a p$^+$ type $Al_{0.5}Ga_{0.5}As$ carrier barrier layer 304 of 0.2 μm thickness, and a p$^+$ type $Al_{0.25}Ga_{0.75}As$ first guide layer 305 of 0.1 μm thickness are formed on an n type GaAs substrate 301 by a first epitaxial growth.

Next, a resist mask of a grating shape with a 0.12 μm pitch is formed on the guide layer 305 which is the highest layer of the grown layers by double beam interference exposure employing a prism having high refraction index. Next, using this resist mask, the guide layer 305 is etched by wet etching to obtain a diffraction grating (first order diffraction grating with duty of 0.5). Next, a p type $Al_{0.25}Ga_{0.75}As$ second guide layer 306 of 5 nm thickness which is to become a buffer layer and a p type GaAs light absorption layer 307 of 25 nm thickness are grown on the diffraction grating. When this is being done, the GaAs covers the entire surface of the diffraction grating but it is grown particularly thick in the valleys of the triangular diffraction grating. Therefore, the thickness of the light absorption layer periodically changes in accordance with the unevenness of the diffraction grating. Next, a p type $Al_{0.75}Ga_{0.25}As$ upper cladding layer 308 of 0.8 μm thickness and a p type GaAs contact layer 309 of 0.5 μm are successively formed by a second epitaxial growth.

Next, an insulating film 310 of about 0.2 μm thickness made of silicon nitride is formed on the p$^+$ type GaAs contact layer 309 by plasma CVD, and a stripe groove of a width of 8 μm is formed on the insulating film of the silicon nitride by photolithography and etching employing hydrofluoric acid. Then, an electrode 311 made of AuZn is formed on the entire surface. The substrate is thinned to about 100 μm and then an AuGe/Ni electrode 312 is formed on the rear surface. The entire device is then heat treated at 400° C., thereby completing the device.

In the present example where AlGaAs material system is employed, the difference of the Al mixed crystal ratio between the active layer 303 and the light absorption layer 307 is 0.13, which corresponds to a condition that the difference between the energy of the induced emission light (wavelength of the induced emission light is 780 nm, which corresponds to converted energy of 1.59 eV) and the forbidden band width (1.42 eV) of the light absorption layer is 0.17 eV. In this device, the discontinuity of the light output-current characteristics resulting from the saturated absorption of the absorption layer is not observed up to the light output of 100 mW, and a stable oscillation at the single longitudinal mode was observed up to high output.

Figure 4:
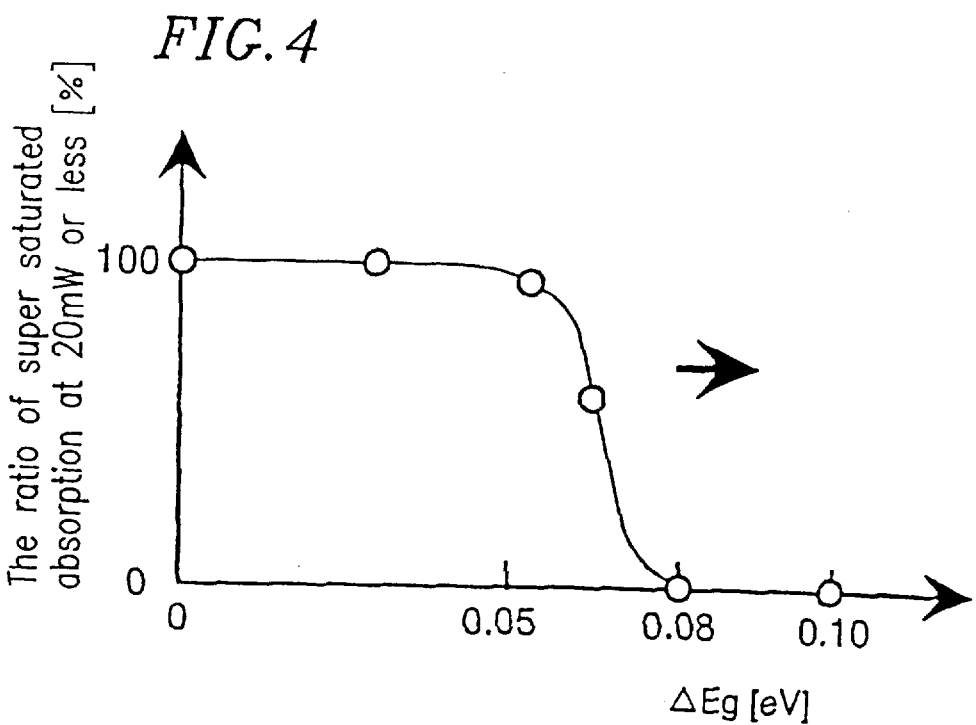
FIG. 4 is a graph illustrating the relationship between $\Delta E_g$, the difference between a forbidden band width of a light absorption layer and an energy value converted from the wavelength of induced emission light, and the frequency of occurring saturated absorption within the structure of the second example.

Devices having the same structure illustrated in the present example but having various values for the Al mixed crystal ratio of the absorption layer are produced, and a correlation between $\Delta E_g$, the difference between the forbidden band width of the periodic light absorption layer and the energy of the induced emission light, and the ratio of the number of devices which show the characteristics deterioration due to the saturated absorption under the light output of 20 mW is illustrated in FIG. 4. It was experimentally confirmed that the ratio of the number of the devices which showed the saturated absorption for the light output of 20 mW or below when the $\Delta E_g$ was 0.08 eV or greater is zero. Here, these devices are produced such that even if $\Delta E_g$ is changed, other design parameters (such as gain coupled constant, light confinement factor of the active layer, or the like) stay the same.

Figure 5:
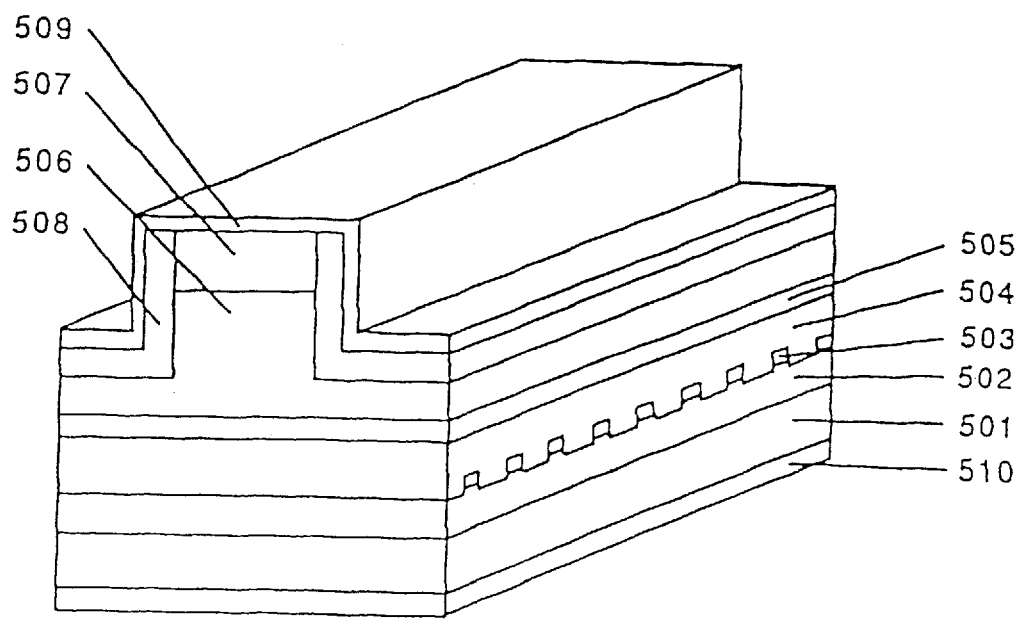
FIG. 5 is an isometric view illustrating a gain coupled DFB-LD of a third example.

FIG. 5 is an isometric view illustrating a structure of a distributed feedback semiconductor laser of a third example of the present invention.

In this example, first, an n type InP first lower cladding layer 502 of 0.5 μm thickness and an n type InGaAsP ($E_g$ =0.80 eV) light absorption layer 503 of 25 nm thickness are formed on an n type InP substrate 501 by a first epitaxial growth. Next, a first order rectangular diffraction grating (about 0.24 μm pitch; duty being 0.5) is formed on the light absorption layer 503 which is the highest layer of the grown layers by double beam interference exposure and wet etching. Next, an n type InP second lower cladding layer 504 of 0.3 μm thickness, an undoped InGaAsP (wavelength of the induced emission light is 1.3 μm, which corresponds to converted energy of 0.95 eV) active layer 505 of 0.1 μm, a p type InP upper cladding layer 506 of 1 μm thickness, and a p$^+$ type InGaAs contact layer 507 of 0.5 μm thickness are formed on the diffraction grating by a second epitaxial growth.

Next, a resist mask of a stripe shape of a width of 3 μm is formed by photolithography, and the contact layer 507 and the upper cladding layer 506 are etched down to 0.3 μm above the active layer by wet etching, thereby forming them into a ridge shape. Then an insulating film 508 made of silicon nitride of about 0.2 μm is formed on the entire front surface by plasma CVD, and only the portion of the insulating film on top of the ridge is removed. Finally, the substrate is thinned to about 100 μm thickness, and electrodes 509 and 510 are formed on the front and rear surfaces, respectively, by vacuum evaporation, thereby completing the device.

The discontinuity of the light output-current characteristics resulting from the saturation of the absorption layer is not observed up to the light output of 50 mW or above, and a stable oscillation in the single longitudinal mode was confirmed.

Figure 6:
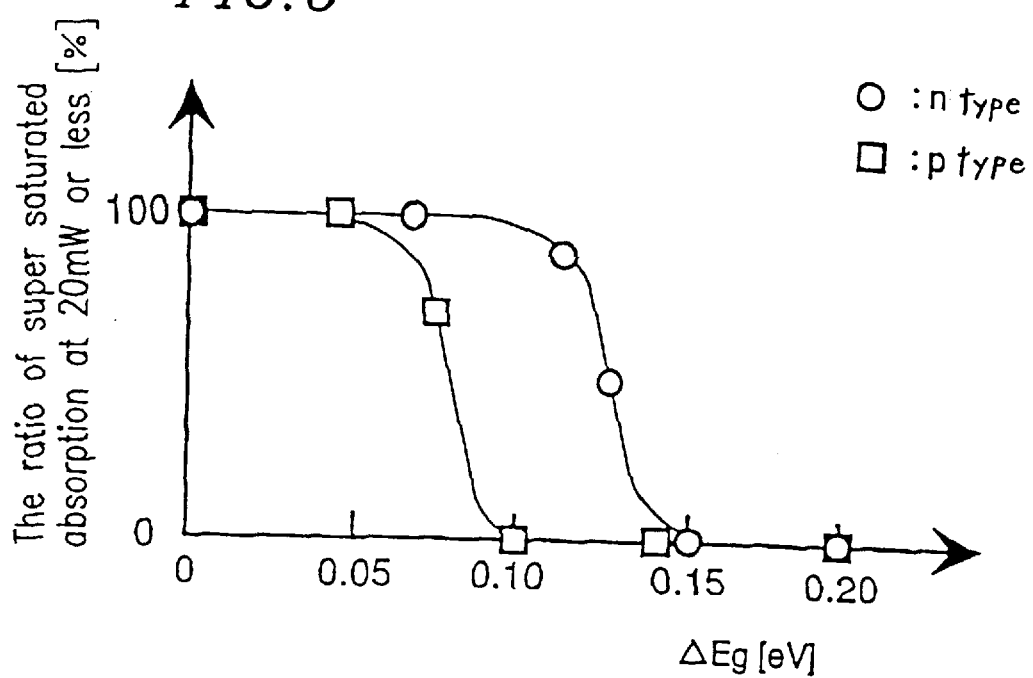
FIG. 6 is a graph illustrating the relationship between $\Delta E_g$, the difference between a forbidden band width of a light absorption layer and an energy value converted from the wavelength of induced emission light, and the frequency of occurring saturated absorption within the structure of the third example.
Figure 7:
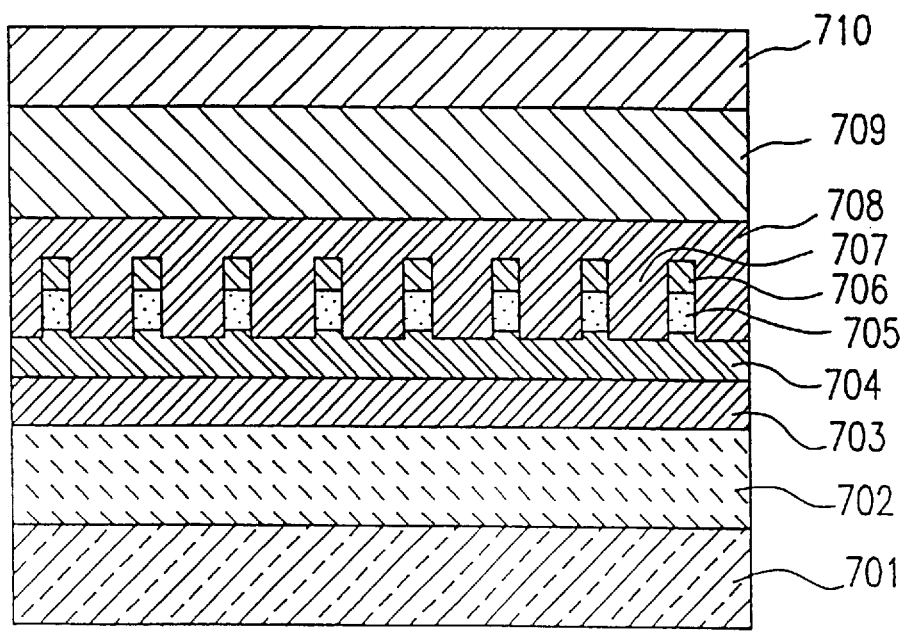
FIG. 7 is a cross-sectional view of a conventional gain coupled DFB-LD.

Devices having the same structure illustrated in the present example but with the conductivity type of the light absorption layer and the forbidden band width of the light absorption layer being changed to have various values are produced, and a correlation between $\Delta E_g$, the difference between the forbidden band width of the periodic light absorption layer and the energy of the induced emission light, and the ratio of the number of devices which show the characteristics deterioration due to the saturated absorption for the light output of 20 mW or below is illustrated in FIG. 6. It was experimentally confirmed that the ratio of the number of devices showing the saturated absorption for the light output of 20 mW or below was zero when $\Delta E_g$ was 0.15 eV or above for an n type light absorption layer and when $\Delta E_g$ was 0.1 eV or above for a p type light absorption layer. Here, these devices are produced such that even if $\Delta E_g$ is changed, other design parameters (such as a lattice constant, gain coupled constant, light confinement factor of the active layer, or the like) remain constant.

In the present invention, as long as a gain coupled DFB-LD includes a structure where an absorption coefficient periodically changes, a material system is not limited to those referred to in the above-described examples, and the present invention can be applied to other material systems including (Al, Ga, In)(P, As, N), (Zn, Mg, Cd)(S, Se) or the like. Moreover, the active layer may be of quantum well structure. Moreover, the arrangement of the light absorption layer is not limited to those described above. Furthermore, the present invention is not limited by the shape of the striped region along the light transmitting region or by the production method. Moreover, the present invention can be applied to a structure where the periods of the perturbation of the refraction index and the perturbation of the gain (loss) are equal and the phase is shifted or to a structure where the periodic light absorption layer is arranged outside the striped region along the light transmitting region.

According to the distributed feedback semiconductor laser of the present invention, a material for a periodic light absorption layer is selected such that electrons in a valence band of the periodic absorption layer are excited to an energy state higher than an energy state where free electrons in a conduction band are thermally distributed. As a result, absorption saturation in the light absorption layer is curbed. Therefore, a structure having stable single longitudinal mode characteristics even during high output can be obtained. Also, this structure is achieved by making the forbidden band width of the periodic absorption layer to be larger than the energy of the induced emission light emitted from the active layer by a fixed amount, thereby effectively curbing saturated absorption.

Also, when a difference between the forbidden band width of the active layer and that of the periodic absorption layer is large, an absorption coefficient of the periodic absorption layer does not fluctuate due to impurity densities or light energy, whereby a device having stable characteristics can be produced with excellent repeatability.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A gain coupled distributed feedback semiconductor laser, comprising:

an active layer; and a diffraction grating provided in the vicinity of said active layer, and having a periodic light absorption layer which includes a plurality of light absorption sections periodically arranged along a resonator length direction, wherein:

said periodic light absorption layer is formed of n type $Al_xGa_{1-x}As$ ($0 \leq x \leq 1$);

a thickness of said periodic light absorption layer is larger than a de Broglie wavelength of an electron; and a difference between an energy hv of an induced emission light and a forbidden band width $E_g$ of said periodic light absorption layer is about 0.13 eV or greater where h is Planck's constant and v is a frequency of said induced emission light.

2. A gain coupled distributed feedback semiconductor laser according to claim 1, wherein a cross-section of said plurality of light absorption sections, which is sectioned by a plane perpendicular to said active layer and parallel to said resonator length direction, is rectangular.

3. A gain coupled distributed feedback semiconductor laser according to claim 1, wherein a cross-section of said plurality of light absorption sections, which is sectioned by a plane perpendicular to said active layer and parallel to said resonator length direction, is triangular.

4. A gain coupled distributed feedback semiconductor laser according to claim 1, wherein said plurality of light absorption sections are provided discontinuously.

5. A gain coupled distributed feedback semiconductor laser, comprising:

an active layer; and a diffraction grating provided in the vicinity of said active layer, and having a periodic light absorption layer which includes a plurality of light absorption sections periodically arranged along a resonator length direction, wherein:

said periodic light absorption layer is formed of p type $Al_xGa_{1-x}As$ ($0 \leq x \leq 1$);

a thickness of said periodic light absorption layer is larger than a de Broglie wavelength of an electron; and a difference between an energy hv of an induced emission light and a forbidden band width $E_g$ of said periodic light absorption layer is about 0.08 eV or greater where h is Planck's constant and v is a frequency of said induced emission light.

6. A gain coupled distributed feedback semiconductor laser according to claim 5, wherein a cross-section of said plurality of light absorption sections, which is sectioned by a plane perpendicular to said active layer and parallel to said resonator length direction, is rectangular.

7. A gain coupled distributed feedback semiconductor laser according to claim 5, wherein a cross-section of said plurality of light absorption sections, which is sectioned by a plane perpendicular to said active layer and parallel to said resonator length direction, is triangular.

8. A gain coupled distributed feedback semiconductor laser according to claim 5, wherein said plurality of light absorption sections are provided discontinuously.

* * * * *

UNITED STATES PATENT AND TRADEMARK OFFICE
CERTIFICATE OF CORRECTION

PATENT NO. : 5,852,625
DATED : December 22, 1998
INVENTOR(S) : Koji Takahashi

It is certified that error appears in the above-identified patent and that said Letters Patent is hereby corrected as shown below:

Include on the first page after the Inventor field --[73] Assignee: Sharp Kabushiki Kaisha, Osaka, Japan--.

Signed and Sealed this

Twenty-first Day of March, 2000

Attest:

*Attesting Officer*

Q. TODD DICKINSON
*Commissioner of Patents and Trademarks*